(12) United States Patent
Driscoll et al.

(10) Patent No.: US 12,092,668 B2
(45) Date of Patent: Sep. 17, 2024

(54) EFFICIENT COLLABORATION BETWEEN METERS UNDER THE SAME TRANSFORMER

(71) Applicant: Itron, Inc., Liberty Lake, WA (US)

(72) Inventors: Timothy James Driscoll, Raleigh, NC (US); Gokulmuthu Narayanaswamy, Bangalore (IN); Robert Carl Sonderegger, Berkeley, CA (US); Michael Hogan Dann, Oakland, CA (US)

(73) Assignee: Itron, Inc., Liberty Lake, WA (US)

( * ) Notice: Subject to any disclaimer, the term of this patent is extended or adjusted under 35 U.S.C. 154(b) by 357 days.

(21) Appl. No.: 17/553,442

(22) Filed: Dec. 16, 2021

(65) Prior Publication Data
US 2023/0194582 A1   Jun. 22, 2023

(51) Int. Cl.
| | | |
|---|---|---|
| *G01R 21/133* | (2006.01) | |
| *G01R 22/06* | (2006.01) | |
| *G01R 25/00* | (2006.01) | |

(52) U.S. Cl.
CPC ......... *G01R 21/133* (2013.01); *G01R 22/063* (2013.01)

(58) Field of Classification Search
CPC .. G01R 19/2513; G01R 25/00; G01R 21/133; G01R 22/063; G01R 22/061
See application file for complete search history.

(56) References Cited

U.S. PATENT DOCUMENTS

| | | | | |
|---|---|---|---|---|
| 2014/0167738 A1* | 6/2014 | Makinson | ............ | H05K 1/0263 324/126 |
| 2015/0078256 A1* | 3/2015 | Van Wyk | ............... | H04L 47/365 370/328 |
| 2016/0154040 A1* | 6/2016 | Driscoll | ................ | G01D 4/002 324/76.77 |
| 2017/0344045 A1* | 11/2017 | Forbes, Jr. | ............. | H04L 67/10 |
| 2018/0011134 A1* | 1/2018 | Freer | ..................... | G01R 31/66 |

* cited by examiner

*Primary Examiner* — Jermele M Hollington
*Assistant Examiner* — Temilade S Rhodes-Vivour
(74) *Attorney, Agent, or Firm* — Lee & Hayes, P.C.

(57) ABSTRACT

In an electrical grid, several electricity meters may be associated with the same transformer, and may measure electricity sold to respective customers. In an example, one electricity meter executes manager software, while the other electricity meters execute agent software. One or more applications operated on each electricity meter, and control metrology devices, data processing, operation of radio(s) and/or a powerline communications modem, aspects of electrical phase determination, etc. The agent software operating on each electricity meter may relay messages from applications operating on that electricity meter to other (possibly similar) applications operating on other electricity meters. Each message sent by each instantiation of agent software may include a networking score of that electricity meter. The manager software may additionally communicate with a data collector and/or main office server(s). The manager software may select a replacement meter from among those connected to the same transformer to assume the role of executing manager software.

22 Claims, 11 Drawing Sheets

EFFICIENT COLLABORATION BETWEEN METERS UNDER THE SAME TRANSFORMER

BACKGROUND

In an electrical power supply grid, meters associated with the same transformer form a significant electrical entity. The entity is based at least in part on those meters' shared concerns, including secondary side voltage at the transformer, combined load on the transformer, and aspects of a power line communications (PLC) network.

In a traditional automation of electricity distribution, electrical power and control flows only from the substation to the feeder(s) and transformer(s). This arrangement fails to fully develop the potential of smart metering devices. Additionally, conventional networks and configurations of networked devices fail to overcome communication problems associated with low data rates between network devices and headend or main office computing facilities.

Moreover, similar problems limit the abilities of networked smart devices in many non-utility industry networks, edge computing generally, and even more generally in the context of the internet of things.

BRIEF DESCRIPTION OF THE DRAWINGS

The detailed description is described with reference to the accompanying figures. In the figures, the left-most digit(s) of a reference number identifies the figure in which the reference number first appears. The same numbers are used throughout the drawings to reference like features and components. Moreover, the figures are intended to illustrate general concepts, and not to indicate required and/or necessary elements.

DETAILED DESCRIPTION

Overview

Techniques that provide efficient data collaboration between electricity meters connected to the same transformer are described. Techniques that provide efficient data collaboration between edge devices on a network are also described. The techniques described herein are applicable in a variety of industries, such as agriculture, transportation, warehousing, and others.

Example System and Techniques

Figure 1:
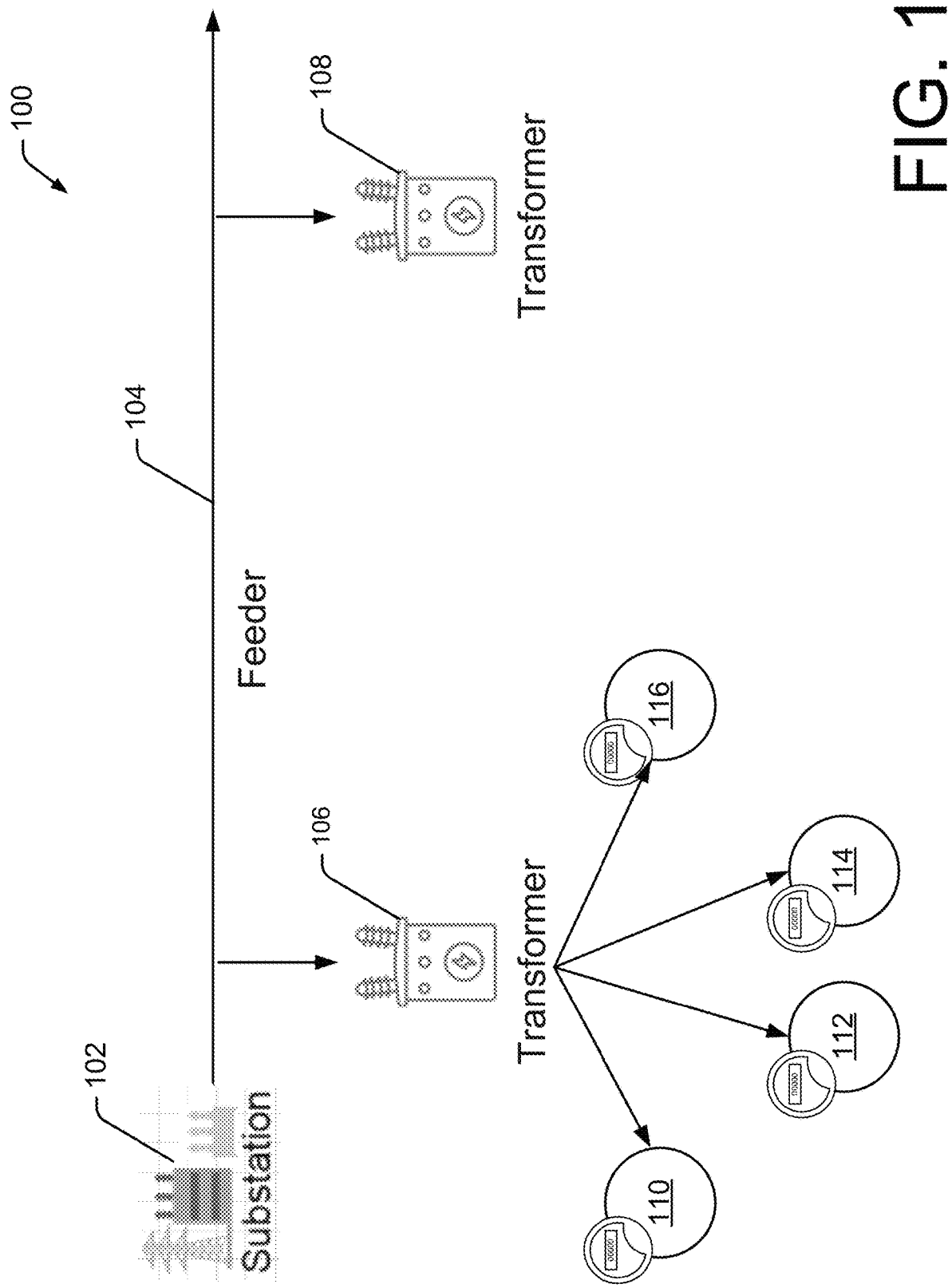
FIG. 1 is a block diagram showing an example portion of an electrical grid, particularly showing a transformer and a group of electricity meters connected to that transformer.

FIG. 1 shows an example portion of an electrical grid 100. A substation 102 provides electricity to one or more feeder lines 104, which in turn provide electricity to a plurality of transformers, including a first transformer 106 and a second transformer 108. For purposes of illustration, transformer 106 provides electricity to four metering devices 110-116, each representing a customer on the electrical grid 100.

In a further example, the electricity distribution system or grid 100 has a plurality of transformers connected to the feeder that comes from the substation. Each transformer serves one or more premises, typically ranging from 1 to 500. In some countries, a smaller number of higher amperage services are connected to a transformer, while in other countries a large number of lower amperage services are connected to a transformer. The meters connected to the same transformer form a significant electrical entity. They share the same concerns including secondary side (of the transformer) voltage, the combined load of the meters on the transformer, and/or connectivity of a power line communications (PLC) network. As shown by the one-way arrows, in a traditional automated electrical distribution system, electrical power and control flows only in the direction from the substation to feeder, and then to the transformer.

In the example of FIG. 1, the grid 100 includes advancements over known features and techniques utilized by known advanced metering infrastructure (AMI) electrical grids, wherein every meter sends data directly to the server and receives control commands directly from the server. In an example, the grid 100 utilizes techniques based at least in part on distributed intelligence. Accordingly, the meters 110-116 of the grid 100 may be configured for operations not seen in known AMI electrical grids. In a first example, data collection, aggregation and analysis may be performed among the meters, such as by using distributed intelligence techniques. The meters can make local decisions that affect the premises to which each provides electricity. Moreover, the meters may collectively make decisions that affect the group of meters receiving electricity from the same transformer. And further, the meters 110-116 can obtain information about each other's electrical and network communication status, abilities, conditions, electrical loads, voltages, and other factors. This information, shared among the electricity meters associated with each transformer, make a number of benefits possible that were previously unattainable.

Figure 2:
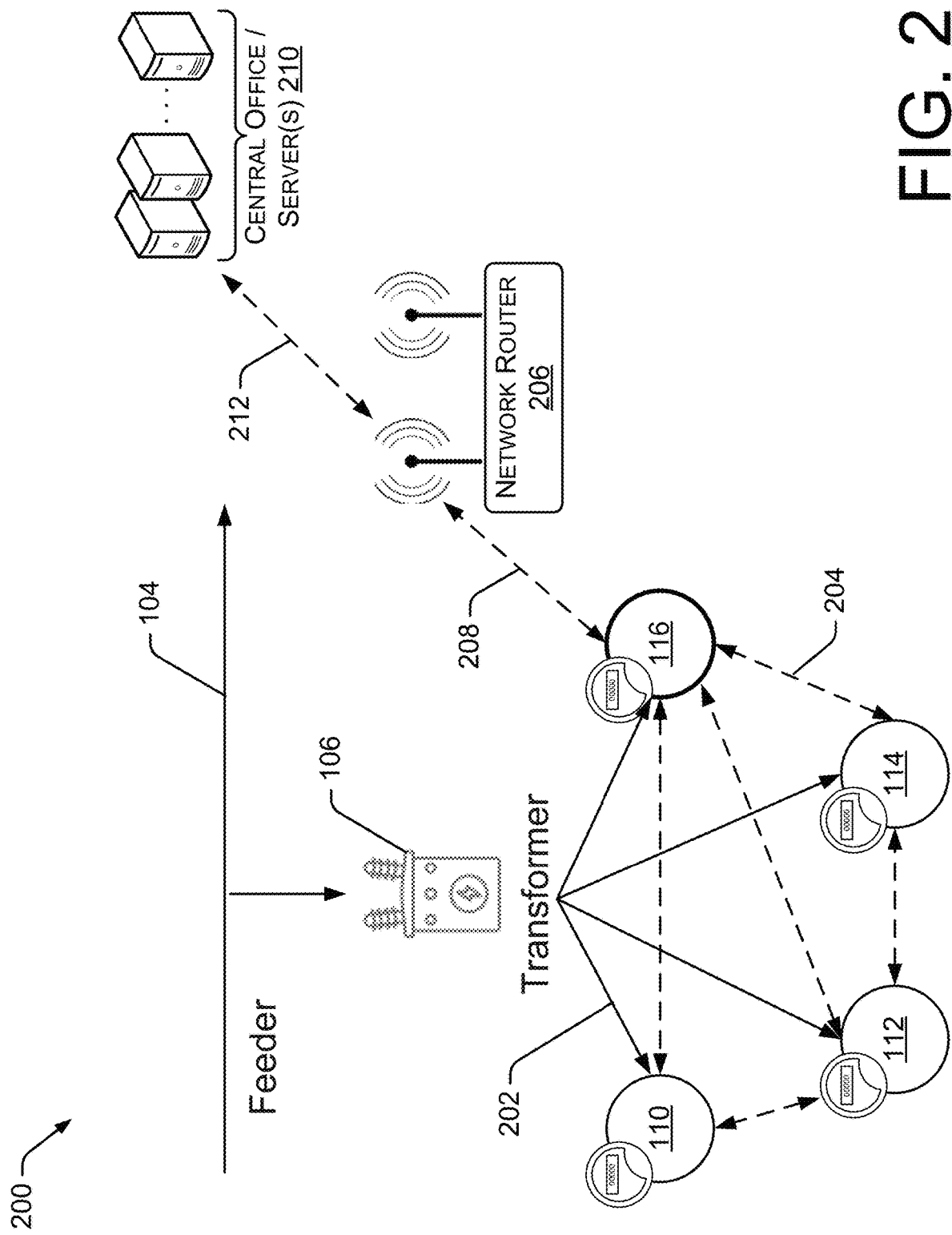
FIG. 2 is a block diagram showing communication between electricity meters connected to a common transformer, and communication with remote computing device(s).

FIG. 2 shows an example system 200 for electricity distribution and communication between electricity meters connected to a common transformer, and shows communication with remote computing device(s). A feeder 104 provides electricity to a transformer 106. The transformer 106 provides electricity to electricity meters 110-116 over wiring 202 (shown as solid lines). Each of the electricity meters 110-116 communicate with one or more other electricity meters over two-way radio frequency (RF) links 204 (shown as dashed lines). Alternatively, or additionally, the electricity meters 110-116 may communicate with other meters using two-way powerline communication (PLC) techniques.

In the example system 200, one meter (in the example shown, electricity meter 116) from among the meters receiving electricity from the transformer 106 is configured as a manager, "spokesmeter" and/or services-provider to the other meters 110-114 associated with the transformer 106. In an example, the manager electricity meter 116 may assist the meters 110-114 including relaying information from the meters to a network router 206. In the example shown, the manager electricity meter 116 may send data to the network router 206 over an RF link 208. The network router 206 may relay the data to a central office and/or server(s) 210 of the central office. The relay may be made at least in part by the internet 212, a private network connection, or other communication means.

In the example system 200, the electricity meters 110-116 communicate, exchange information, and perform aspects of data processing using distributed intelligence techniques. In the example system, a meter may be assigned that coordinates actions of the meters under the same transformer. Such a meter may be considered a manager meter and run manager software. In example operation, the manager meter acts as the "spokesmeter" of the group of meters sharing a common transformer. In an example, the manager meter can aggregate data (e.g., electricity consumption data measured by the manager meter and the non-manager meters of a common transformer) to send data to a server (e.g., the server of a utility company). The non-manager electricity meters may run agent software, which communicates with applications running on each respective meter and which communicates with the manager software running on the manager electricity meter.

Figure 3:
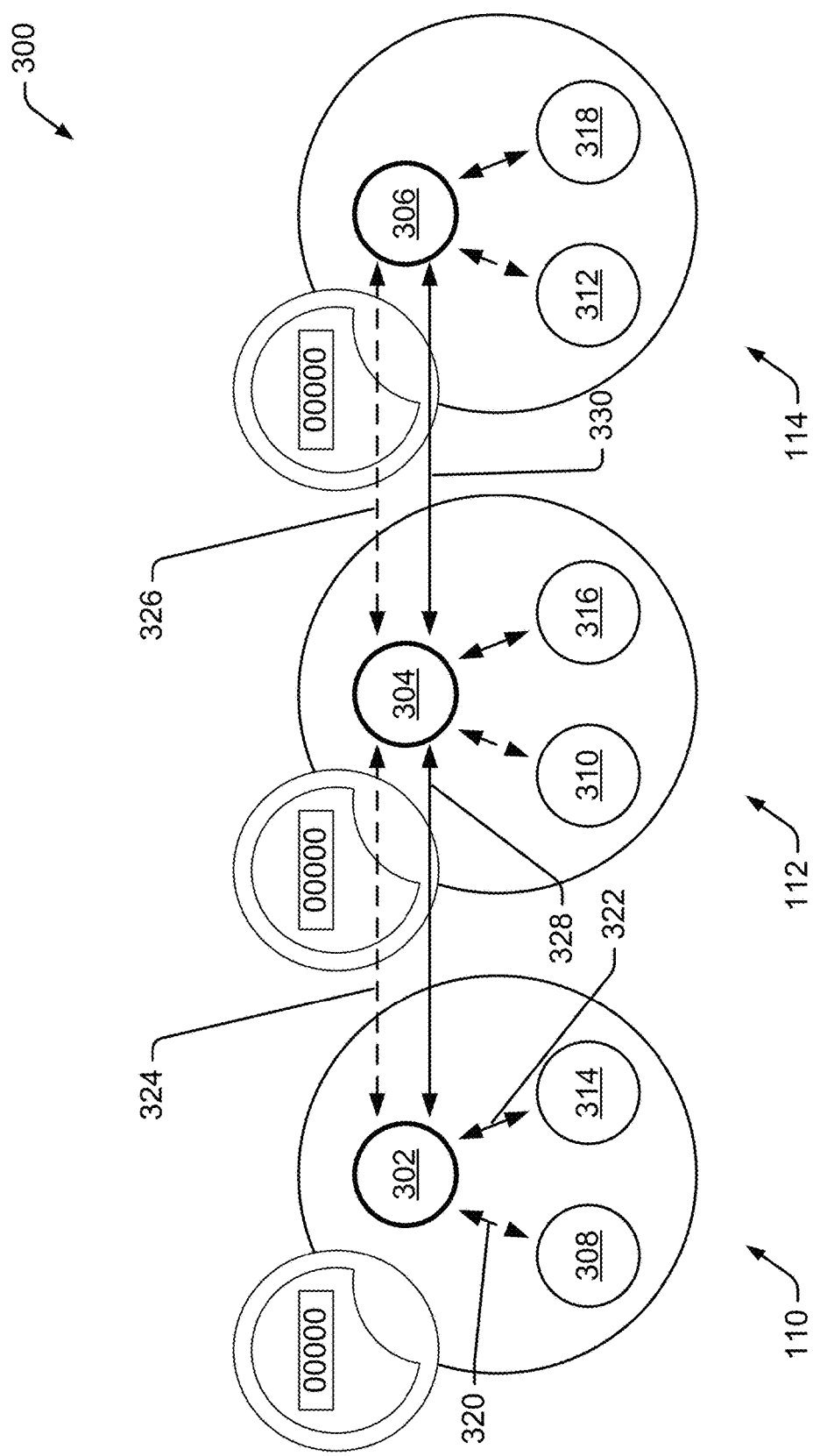
FIG. 3 is a block diagram showing example communication between agent software operating on each electricity meter attached to a common transformer.

FIG. 3 shows an example system 300 including three electricity meters. The example system illustrates aspects of communications between applications operating on a plurality of electricity meters (or other networked devices). In the example, agent software 302, 304, 306 on electricity meters 110, 112, 114, respectively perform data relay and other services to assist in communications between electricity meters. The agent software 302-306 operates on each electricity meter attached to a common transformer; however, one electricity meter (seen in FIG. 5) connected to the common transformer executes manager software (discussed more fully with respect to FIG. 5) rather than agent software.

In the example 300, each electricity meter 110, 112, 114 may include an instantiation of a first type of software application 308, 310, 312, respectively. Similarly, each electricity meter 110, 112, 114 may include an instantiation of a second type of software application 314, 316, 318, respectively. As an example, the first type of software application may perform functions enabling resource consumption measurement (e.g., the measurement of electricity usage). Such functions may include operating sensors and receiving data from the sensors. The second type of software application may perform functions managing collected electricity consumption data, such as recording consumption values, time of consumption, voltage levels, etc. The functionality of other types of software applications (not shown for drawing clarity) may include the operation of a radio, operation of a PLC modem, operation of a user interface of the electricity meter, operation of anti-theft and/or grid topology functions, etc. Accordingly, each meter may have a number of applications, and the applications may receive commands, generate data, send data, receive software updates, etc., through communications managed by, and relayed through, the respective agent software 302-306 associated with each application's electricity meter.

In the example shown, the agent software 302 receives a transmission of data packet(s) 320 (e.g., over a bus or wiring) from an application 308 of a first type (e.g., an application that operated metrology devices). The agent software 302 may also receive a transmission of data packet(s) 322 from an application of a second type (and possibly a number of additional applications of other types). In an example, the second type of application may operate a radio, a PLC modem or other communications device(s) or perform data processing functions.

Figure 5:
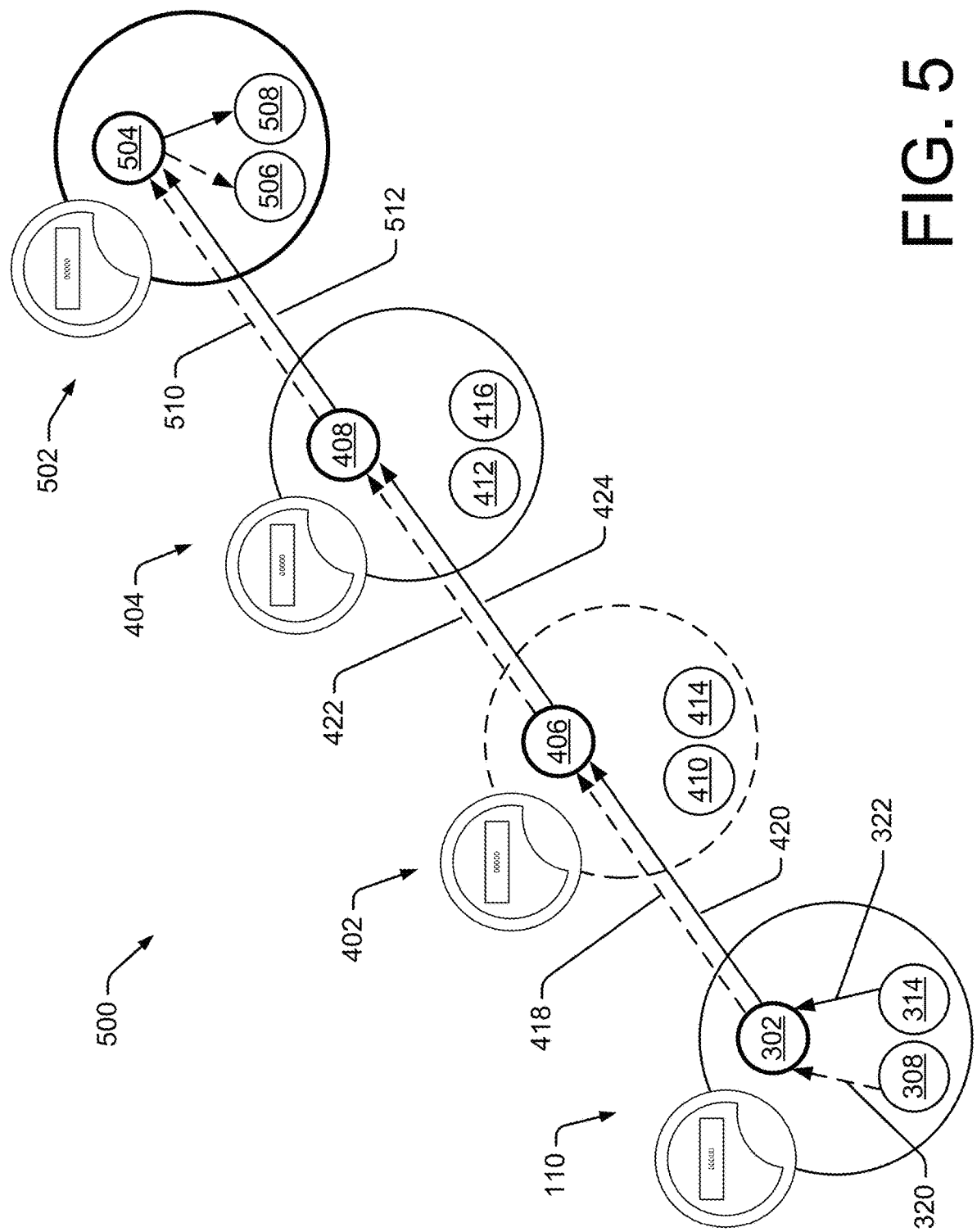
FIG. 5 is a block diagram showing an example portion of an electricity grid, wherein message(s) from application(s) operating on a first electricity meter operating agent software are transmitted to application(s) operating on a second electricity meter operating manager software.

The agent software 302 causes transmission of data packet(s) associated with the first type of application (e.g., by an RF or PLC signal 324) from the electricity meter 110 to the electricity meter 112. Agent software 304 operating on the electricity meter 112 relays the data packet(s) (e.g., by an RF or PLC signal 326) to the agent software 306 operating on the electricity meter 114. Similarly, the data packet(s) may be relayed to an electricity meter operating manager software (e.g., as shown in FIG. 5). Similarly, data packets from the applications of the second type 314, 316, 318 may be relayed by RF and/or PLC signal 328, 330.

Figure 4:
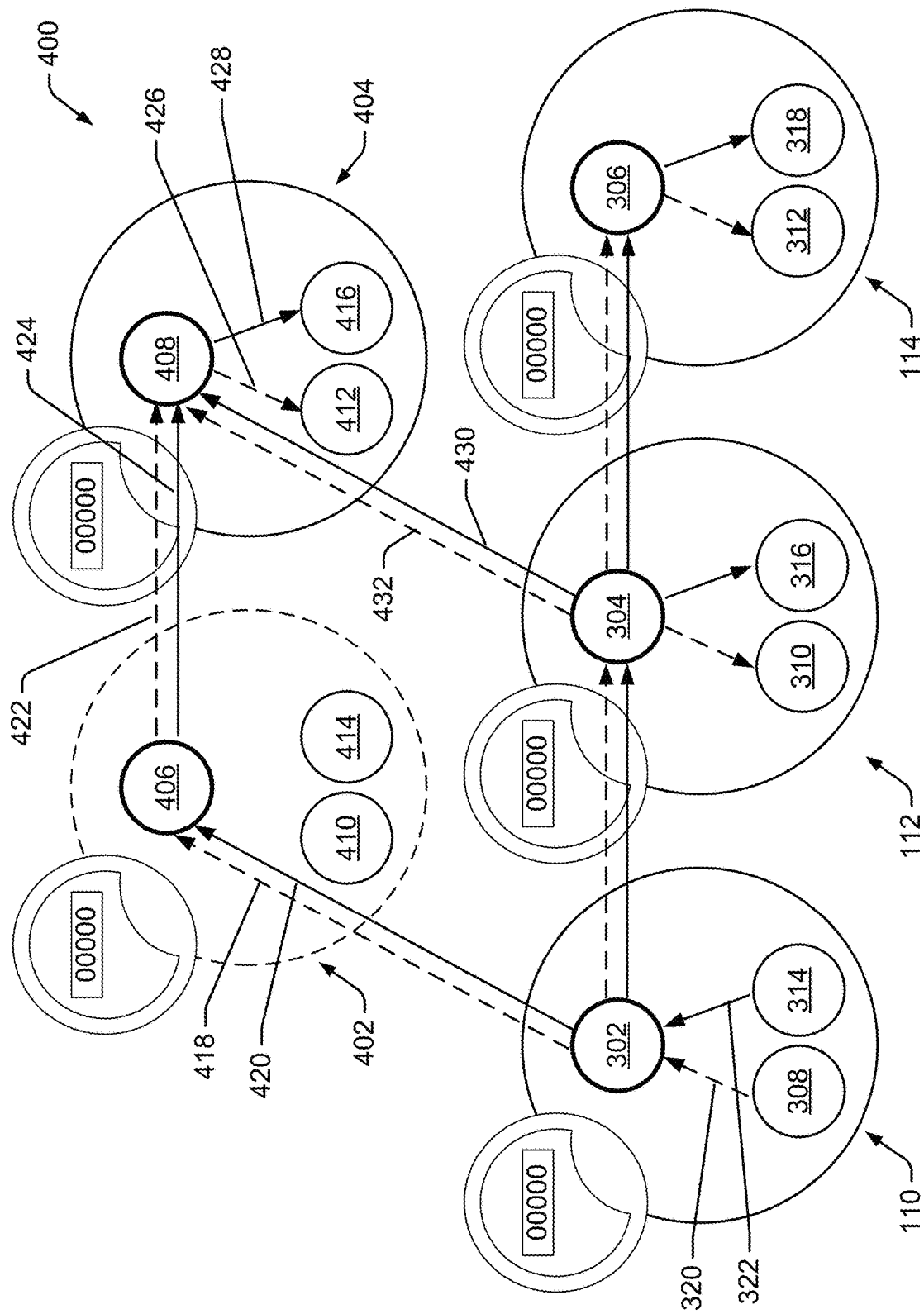
FIG. 4 is a block diagram showing example transmission of a message from application(s) operating on one electricity meter to similar application(s) operating on another electricity meter(s), including relaying actions performed by an electricity meter attached to a different transformer.

FIG. 4 shows an example portion of an electricity grid 400, and an example function or use case. The example illustrates transmission of a message from application(s) operating on one electricity meter to similar types of application(s) operating on another electricity meter(s), with both electricity meters being attached to the same transformer. In the example, the message (e.g., data packets) is relayed by an electricity meter 402 attached to a different transformer, than electricity meters 110, 112, 114 and 404. The electricity meter 402 (shown in dashed line to indicate that it receives electricity from a different transformer) is in communication with electricity meters 110 and 404.

In the example, a first message from application 308 and a second message from application 314 are relayed by the agent 302 of electricity meter 110 using RF links 418, 420, respectively, to the agent 406 of electricity meter 402 (and to the agent 304 of electricity meter 112). The electricity meter 402 may be in RF communication with the agent 302 of electricity meter 110 and the agent 408 of electricity meter 404. Thus, while the electricity meter 402 is not on the same transformer as the other meters shown, it may be geographically nearby. And further, the electricity meter 402 may have a more effective RF link (fewer lost packets, less power used, etc.) with electricity meter 404 than electricity meter 110 has with electricity meter 404. In some cases, the electricity meter 404 may be out of RF range for electricity meter 110. Accordingly, the agent 406 may send the first and second messages to the agent software 408 over RF links 422, 424, respectively. The agent 406 may relay the messages or packets 426, 428 to the applications 412, 416, respectively, over wiring or buses.

In an example, RF links 418, 420 may be the same RF link used at different times (similarly, lines 422, 424 may be the same link, used at different times).

Using relays, the first and second messages are received by the applications 412, 310, 312 and applications 416, 316, 318, respectively. The applications 410, 414, operating on the electricity meter 402 (attached to a different transformer) do not receive the messages.

FIG. 5 shows an example portion of an electricity grid 500, and an example function or use case. In the example, message(s) from application(s) 308, 314 operating on a first electricity meter 110 (which also operates agent software 302) are transmitted to application(s) 506, 508 operating on a second electricity meter 502 operating manager software 504. In the example shown, electricity meter 402 is shown in dashed line to indicate that it is associated with a different transformer than the other electricity meters. Electricity meter 502 is shown in a bold line to indicate that it is operating manager software 504.

In example operation of the portion of the electricity grid 500, an application of a first type (e.g., operation of metrology devices) sends packets 320 through wiring or bus to the agent software 302 of electricity meter 110, while an application of a second type (e.g., performance of data processing tasks) sends packets 322 through wiring or bus to the agent software 302. The agent software 302 relays the packets (using one or more time periods of a single channel and/or different channels 418, 420) to the agent software 406 running on the electricity meter 402. Agent software 406 relays the packets to agent software 408 operating on electricity meter 404. Agent software 408 relays the packets to manager software 504 operating on electricity meter 502 using different timeslots on one channel or using multiple channels 510, 512. The manager software 504 passes the packets from applications 308, 314 of electricity meter 110 to an application 506 of the first type and application 508 of the second type, respectively.

Figure 6:
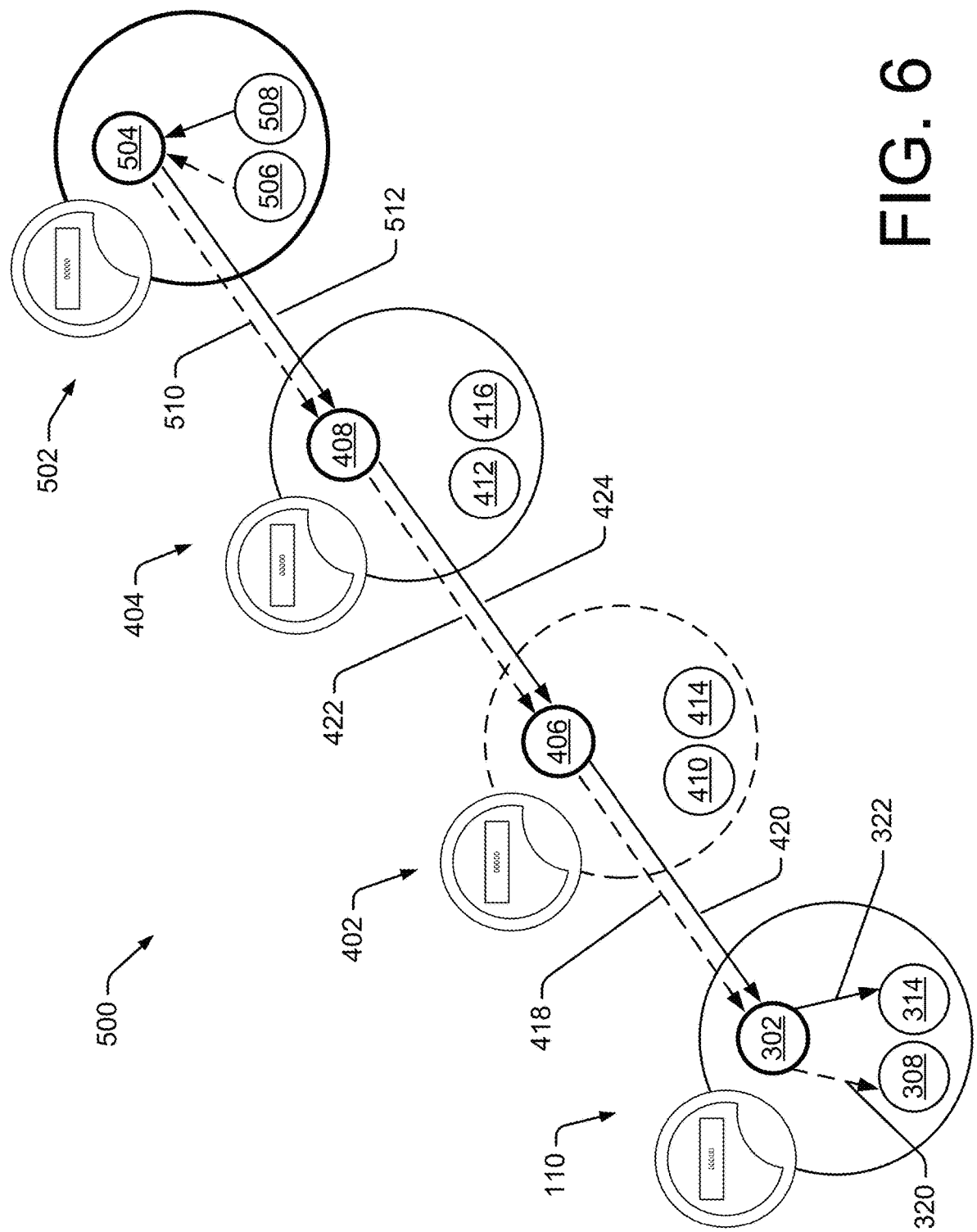
FIG. 6 is a block diagram showing example transmission of a response from application(s) operating on the second electricity meter operating manager software to application(s) operating on the first electricity meter operating agent software, with the electricity meters associated with a common transformer.

FIG. 6 shows the example portion of an electricity grid 500 first seen in FIG. 5. In the example of FIG. 6, a second function or use case is described wherein the applications 506, 508 of the electricity meter 502 respond to the messages sent by applications 308, 314. In the example, response message(s) from application(s) 506, 508 operating on the electricity meter 502 (also operating manager software 504) are transmitted to application(s) 308, 314 operating on electricity meter 110 (also operating agent software 302). In a manner similar to that seen in FIG. 5, the transmission of the responses is made in a manner including relays by agent software 408, 406 operating on electricity meters 404, 402, respectively. Accordingly, FIG. 6 illustrates aspects of two-way communication in the electricity grid 500.

Accordingly, non-manager meters associated with a common transformer meter may be configured with agent software that interacts with the manager software of the manager electricity meter in a collaborative manner. Due to the dynamic nature of the network the meter used to function as the manager meter may be dynamic. That is, the manager meter role can be performed by different meters at different times. This may result from factors, such as: changes over time in transmission quality of one or more electricity meters; changes over time in the number, location, and/or identity of metering devices associated with a transformer; etc.

Accordingly, FIGS. 3 through 6 show the interaction of electricity meters (e.g., electricity meters 110, 402, 404) operating agent software (e.g., agent software 302, 406, 408) and an electricity meter 502 operating manager software 504. Additionally, FIG. 5 shows example interaction of meters operating agent software and a meter operating manager software, wherein the agent software on meters connected to the same transformer communicate among themselves and also with manager software on a selected one of the meters of the transformer.

In an example, the agent software (e.g., agent software 302, 406, 408 operating on electricity meters 110, 402, 404, respectively) does not support any business functionality, logic and/or purpose. Instead, applications operating on the electricity meters may be configured to perform those functions, and the agent software is instead configured to perform communications functions, such as data relay, data routing, addressing, packetizing, etc. Thus, applications on the meters may be used to implement rule engines and business logic can use the agent software to communicate with their counterpart applications on other meters and/or to communicate and send data to a central office (e.g., the central office 210 of FIG. 2). Using the functionality provided by the agent software, applications on the electricity meters will be able to perform multiple functions, such as: (1) sending a message to corresponding application(s) (e.g., applications on some or all the meters attached to the same transformer); and (2) sending a message to corresponding application(s) on the electricity meter currently operating manager software; and/or (3) sending a response message to the sender of a message received earlier.

In some examples, transmitted messages may have to be relayed by several meters to reach destination meter(s). As a part of its functionality, the agent software operating on the electricity meters ensures that the messages are appropriately routed and/or relayed to reach their destinations.

Periodically, at prescribed intervals, in response to a command, and/or for other reasons, the network conditions of the meters may be re-assessed. The conditions may include RF interference encountered by each meter, battery levels of each meter (in a natural gas implementation or an internet of things implementation), changes in the landscape (e.g., long-term parked vehicles, trailers, boats, new buildings, houses, garages, etc.). Upon review of the new assessment, if there is a better candidate to operate the manager software, then: (1) the electricity meter previously operating manager software stops doing so, and instead executes agent software; and (2) the better candidate stops executing agent software and begins to execute manager software.

Figure 7:
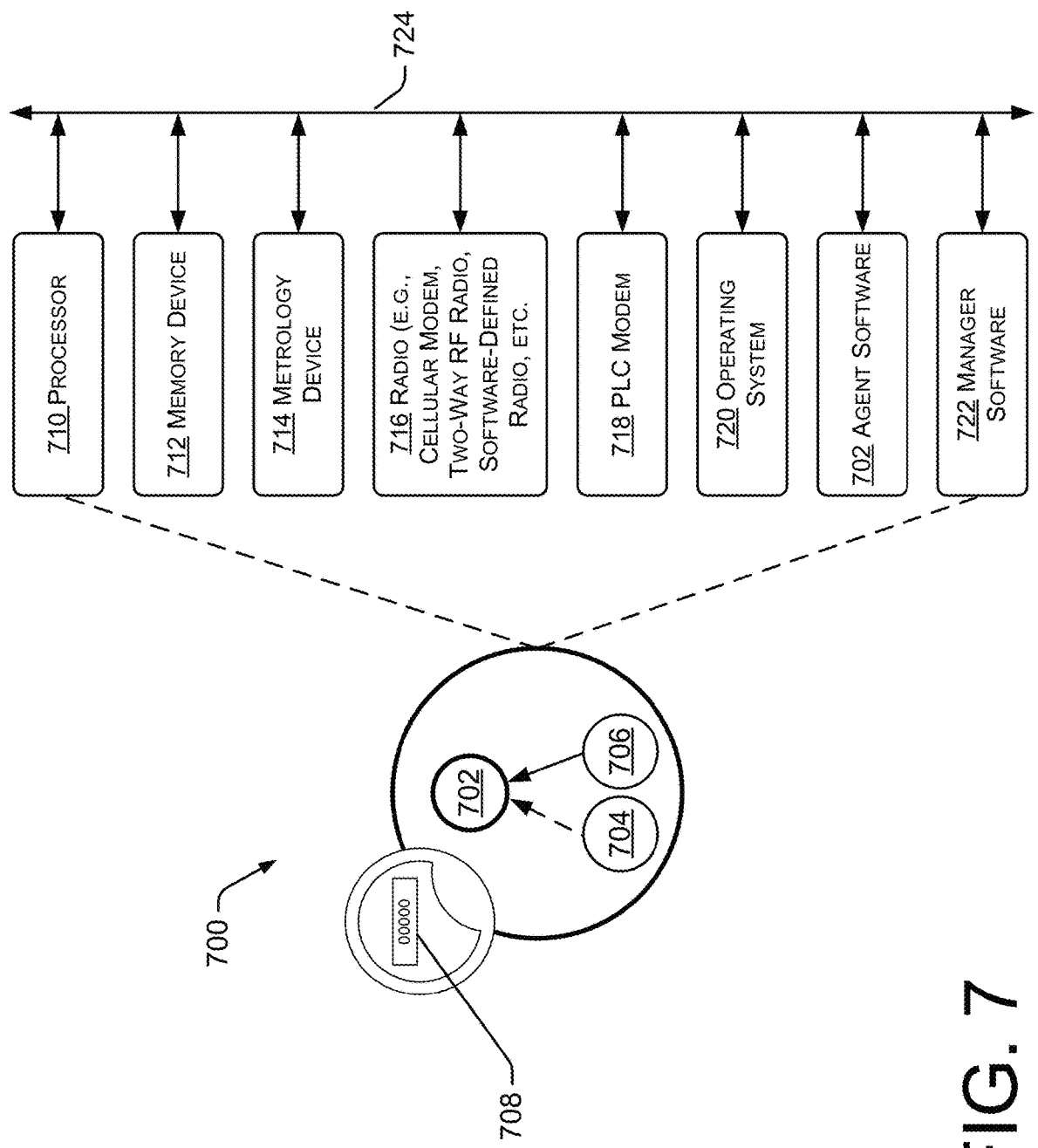
FIG. 7 is a block diagram showing example features of an electricity metering device.

FIG. 7 shows example features of an electricity metering device 700. The electricity metering device 700 is exemplary of those shown in FIGS. 1-6. In the example, the electricity metering device 700 may operate agent software 702. Alternatively, the metering device 700 may operate manager software 722. In the example, only two applications 704, 706 are shown for reasons of drawing clarity. However, any number of applications could be present. A user interface 708 may be present, and may be operated by one of the applications. The features of the electricity metering device may communicate over wiring or a bus 724.

A processor 710 may execute statements or code contained by the memory device 712. The memory device 712 is representative of short-term and long-term memory devices generally, and may comprise one or more devices of one or more technologies and/or functionalities. A metrology device 714 may also be operated by an application, and may be configured to measure kilowatt hours, voltages, zero-crossings, etc. One or more radios 716 may be configured for communication with other metering devices and/or with a router device, cellular tower, etc. The one or more radios may have one or more respective antennas (not shown for drawing clarity). The radios may also communicate with neighboring devices using Wi-Fi, Bluetooth, ZigBee, and others. A powerline communications modem 718 (with antenna, not shown for drawing clarity) may be used to communicate with other electricity metering devices, particularly those on the same transformer. An operating system 720 and associated drivers, basic input/output, etc., is configured to provide a modern operating environment for at least the applications, the agent software 702, and the manager software 722.

The agent software 702 and the manager software 722 are operated in the alternative, in that one is always operating, and one is available and ready to operate, but is not operating (e.g., the agent software is operating and the manager software is available to operate, or the reverse).

Example Methods

In some examples of the techniques discussed herein, the methods of operation may be performed by one or more application specific integrated circuits (ASIC) or may be performed by a general-purpose processor utilizing software defined in computer readable media. In the examples and techniques discussed herein, the memory 712 may comprise computer-readable media and may take the form of volatile memory, such as random-access memory (RAM) and/or non-volatile memory, such as read only memory (ROM) or flash RAM. Computer-readable media devices include volatile and non-volatile, removable and non-removable media implemented in any method or technology for storage of information such as computer-readable instructions, data structures, program modules, or other data for execution by one or more processors of a computing device. Examples of computer-readable media include, but are not limited to, phase change memory (PRAM), static random-access memory (SRAM), dynamic random-access memory (DRAM), other types of random access memory (RAM), read-only memory (ROM), electrically erasable programmable read-only memory (EEPROM), flash memory or other memory technology, compact disk read-only memory (CD-ROM), digital versatile disks (DVD) or other optical storage, magnetic cassettes, magnetic tape, magnetic disk storage or other magnetic storage devices, or any other non-transitory medium that can be used to store information for access by a computing device.

As defined herein, computer-readable media does not include transitory media, such as modulated data signals and carrier waves, and/or signals.

The processing unit may be configured to perform operations causing the efficient data collaboration between electricity meters connected to the same transformer. The processing unit can include a processor 710 and memory device 712, an FPGA, and/or one or more integrated circuits, and the instructions can be stored in memory or implemented in hardware circuits.

Figure 8:
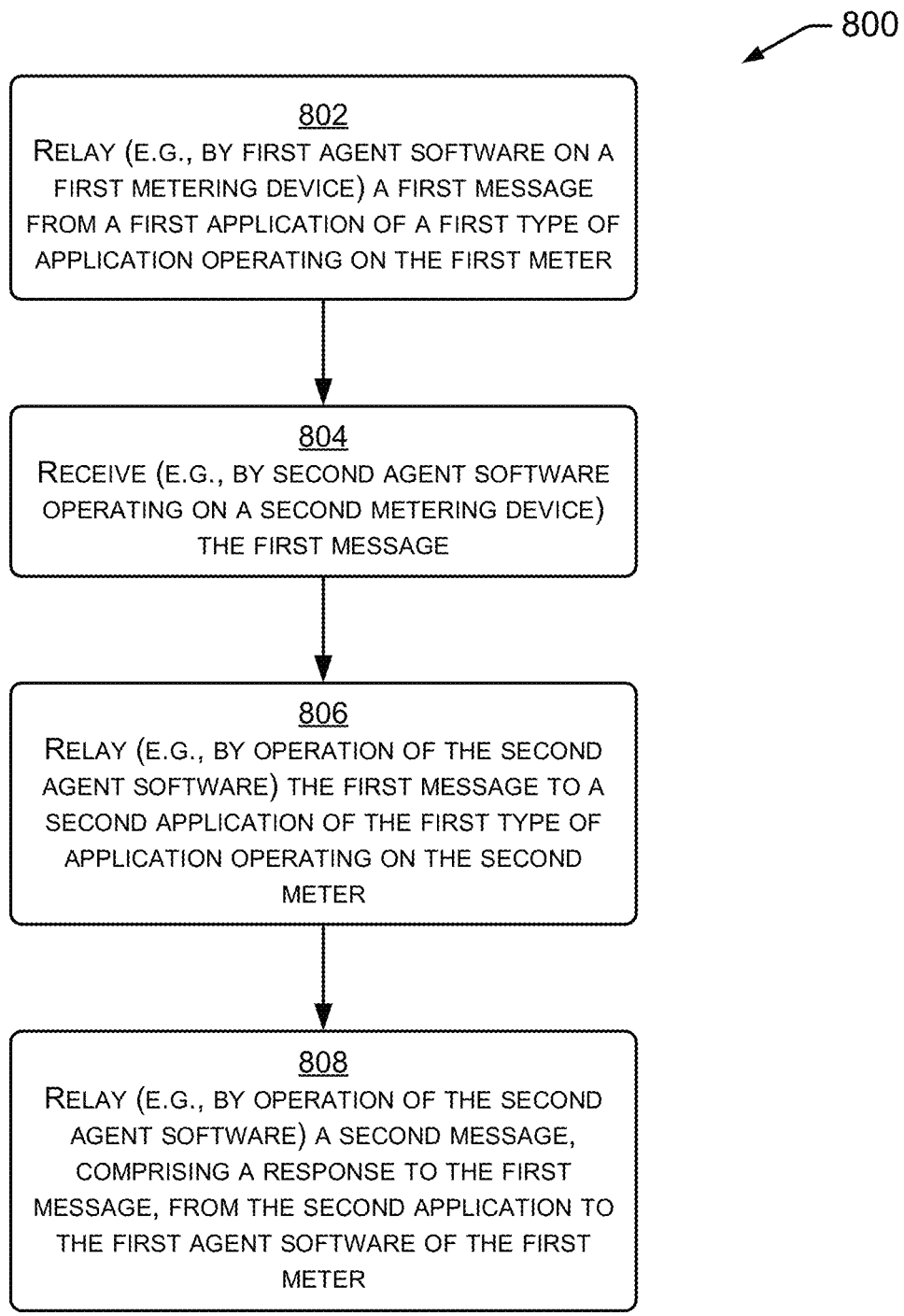
FIG. 8 is a flow diagram showing an example method by which data is relayed and by which communication between electricity meters is performed in a smart electrical grid.

FIG. 8 shows an example method 800 by which data is relayed and by which communication between electricity meters is performed in a smart electrical grid.

At block 802, a first message is relayed (e.g., relayed by first agent software on a first metering device) from a first application of a first type of application operating on the first meter. FIGS. 3-6 show examples of messages being relayed. Referring to FIG. 3, a message originates with application 308 (e.g., an application of a first type) and is received by operation of the agent software 302 operating on electricity meter 110. The agent software 302 relays the message onward, such as to agent software 304 operating on electricity meter 112.

At block 804, the first message is received (e.g., received by second agent software operating on a second metering device). Referring to the example of FIG. 3, the first message may be received by operation of the agent software 304 on electricity meter 112.

At block 806, the first message is relayed (e.g., relayed by operation of the second agent software) to a second application of the first type of application operating on the second meter. Referring to FIG. 3, the agent software 304 relays the first message to application 310, which is an application of a similar type to the originator of the message, i.e., application 308.

At block 808, a second message is relayed (e.g., by operation of the second agent software operating on the second metering device) from the second application to the first agent software of the first meter. The second message may include a response to the first message. Referring to FIG. 6, aspects of the transmission of a response message are described. In FIG. 6, the applications 506, 508 send response messages back to applications 308, 314. As examples, FIG. 5 shows operations resulting in transmission of an initial message(s), and FIG. 6 shows operations resulting in transmission of a response message.

Figure 9:
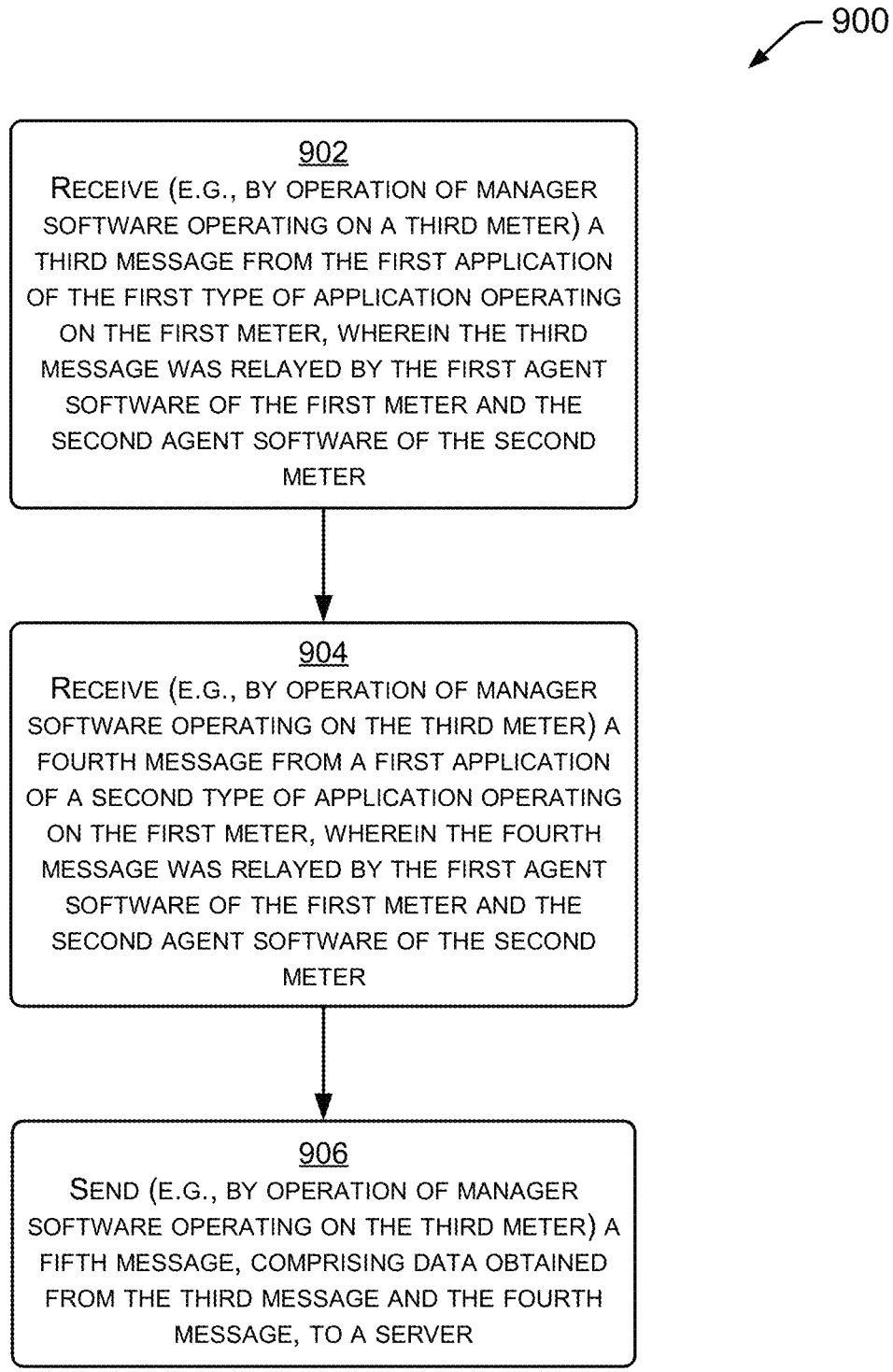
FIG. 9 is a flow diagram showing an example method by which data is received, processed, and transmitted by manager software operating on an electricity metering device of a smart electrical grid.

FIG. 9 shows an example method 900 by which data is received, processed and transmitted by manager software operating on an electricity metering device of a smart electrical grid.

At block 902, a third message is received, such as by operation of manager software operating on a third meter. In an example, the third message may have been relayed by the first agent software of the first meter and the second agent software of the second meter. In the example of FIG. 5, a message may be received by the manager software 504 after being relayed by agent software instantiations 302, 406, 408. The message may have originated from a first application of the first type of application operating on the first meter. Referring again to the example of FIG. 5, the message may have originated from application 308, an application of first type (while application 314 is a different type of application, operating on the same electricity meter).

At block 904, a fourth message from a first application of a second type of application operating on the first meter may be received (e.g., by operation of manager software operating on the third meter). In an example, the fourth message may have been relayed by the first agent software of the first meter and the second agent software of the second meter. Referring again to FIG. 5, the fourth message may have come from the first application of the second type, i.e., application 314.

At block 906, a fifth message may be sent (e.g., by operation of manager software operating on the third meter) to a server. In an example, the fifth message may include data obtained from the third message and the fourth message. Referring to FIG. 2, the manager electricity meter 116 may combine data from messages obtained from other electricity meters to thereby perform aggregating and data processing functions. As seen in FIG. 2, the manager electricity meter 116 may send data by an RF connection (or other type of network) through a router 206 to servers 210 of an office, data processing center, or similar. The combined data may include data from the same type of application operating on a plurality of electricity meters. Alternatively, or additionally, the data may include data from different types of applications operating on a plurality of electricity meters.

Figure 10:
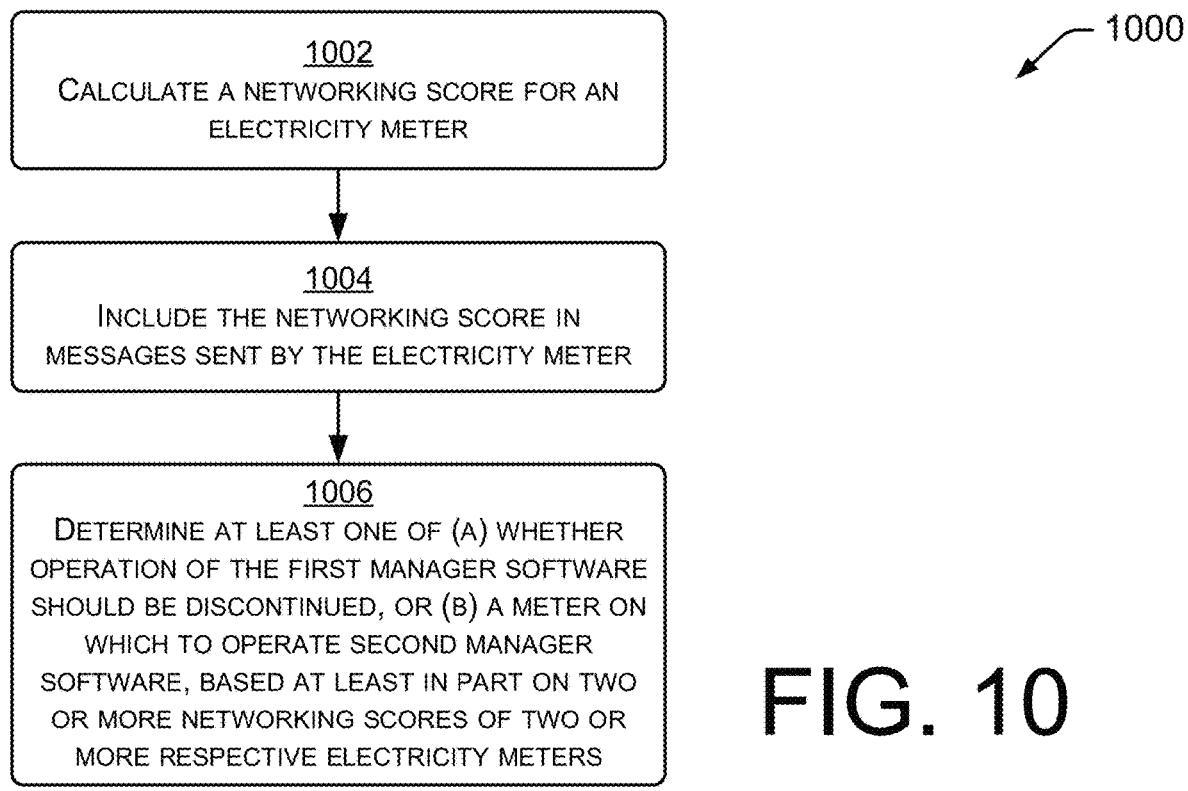
FIG. 10 is a flow diagram showing an example wherein networking scores are calculated by each meter to indicate its own networking performance and fitness to be the manager meter, and are included in each message sent by the meter.

FIG. 10 shows an example method 1000 by which networking scores are calculated by each meter to indicate its own networking performance and fitness to be the manager meter, and may be included in each message sent by the meter.

At block 1002, a networking score is calculated for an electricity meter. In an example, the electricity meter may have an application that calculates the meter's own networking score. The application may base the calculation on packet retransmission rates, packet transmission-repeats, signal strength at other meters, ability to send/receive from most and/or all other electricity meters, etc. The application may or may not receive input from other applications operating on other meters. Input from other meters may include received signal strength information (RSSI), etc.

At block 1004, the networking score may be included in some or all messages sent by the electricity meter. Accordingly, other electricity meters may understand the networking abilities of other meters. Additionally, other electricity meters may respond, such as with RSSI data. In the example of FIG. 2, the manager meter 116 may receive the networking scores attached to messages and may determine if another meter might more successfully operate the manager software.

At block 1006, at least one of: (a) whether operation of the first manager software should be discontinued, or (b) a meter on which to operate second manager software, may be determined. The determination may be based at least in part on one or more networking scores of one or more respective electricity meters. In the example of FIG. 2, an application operating on the manager electricity meter 116 may calculate whether it should relinquish the role of manager electricity meter associated with a particular transformer. Alternatively, or additionally, the manager electricity meter may calculate a replacement to operate the manager software. In some examples, the manager software is already on some or all electricity meters, but is not executed on electricity meters that are executing agent software.

Figure 11:
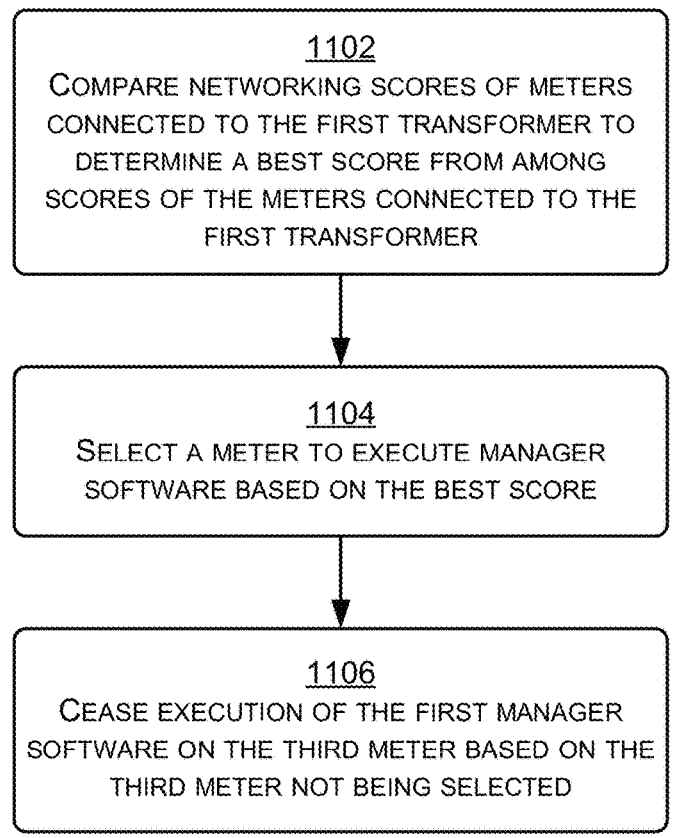
FIG. 11 is a flow diagram showing example operation, wherein networking scores are used and the responsibility for executing manager software is transferred from one electricity meter to another electricity meter.

FIG. 11 shows an example method 1100 by which networking scores are used and the role including execution of manager software is transferred from one electricity meter to another electricity meter. In an example, execution of first manager software: compares networking scores of meters connected to a first transformer to determine a meter with a best score; selects the determined meter to instruct to execute second manager software based on the best score; and ceases to execute (i.e., the first manager software ceases its own execution due to a better score in another meter).

At block 1102, networking scores of meters connected to the first transformer are compared to determine a best score from among scores of the meters connected to the first transformer. In an example, the electricity meter with the best score may exhibit abilities including one or more of: the ability to communicate with all of the electricity meters connected to a transformer; the ability to send packets to other electricity meters with fewer retries than other electricity meters experience; the ability to communicate with a network router or the home office; the ability to minimize the need for agents to relay messages; the ability to send messages to other electricity meters with a higher RSSI, etc.

At block 1104, a meter to execute manager software may be selected based on the best score. The best score may be based on a weighted summation of one or more of the above-listed abilities and/or other abilities.

At block 1106, execution of the first manager software on the third meter is ceased based on the third meter not being selected. Referring to the example of FIG. 5, the third meter 502 connected to a transformer is serving as the manager meter for meters 110 and 404, which are also connected to the same transformer. Note that meter 402 is connected to a different transformer. If the electricity meter 502 ceases to operate manager software, then one of the remaining electricity meters will begin to operate manager software, presumably in a more efficient manner.

Figure 12:
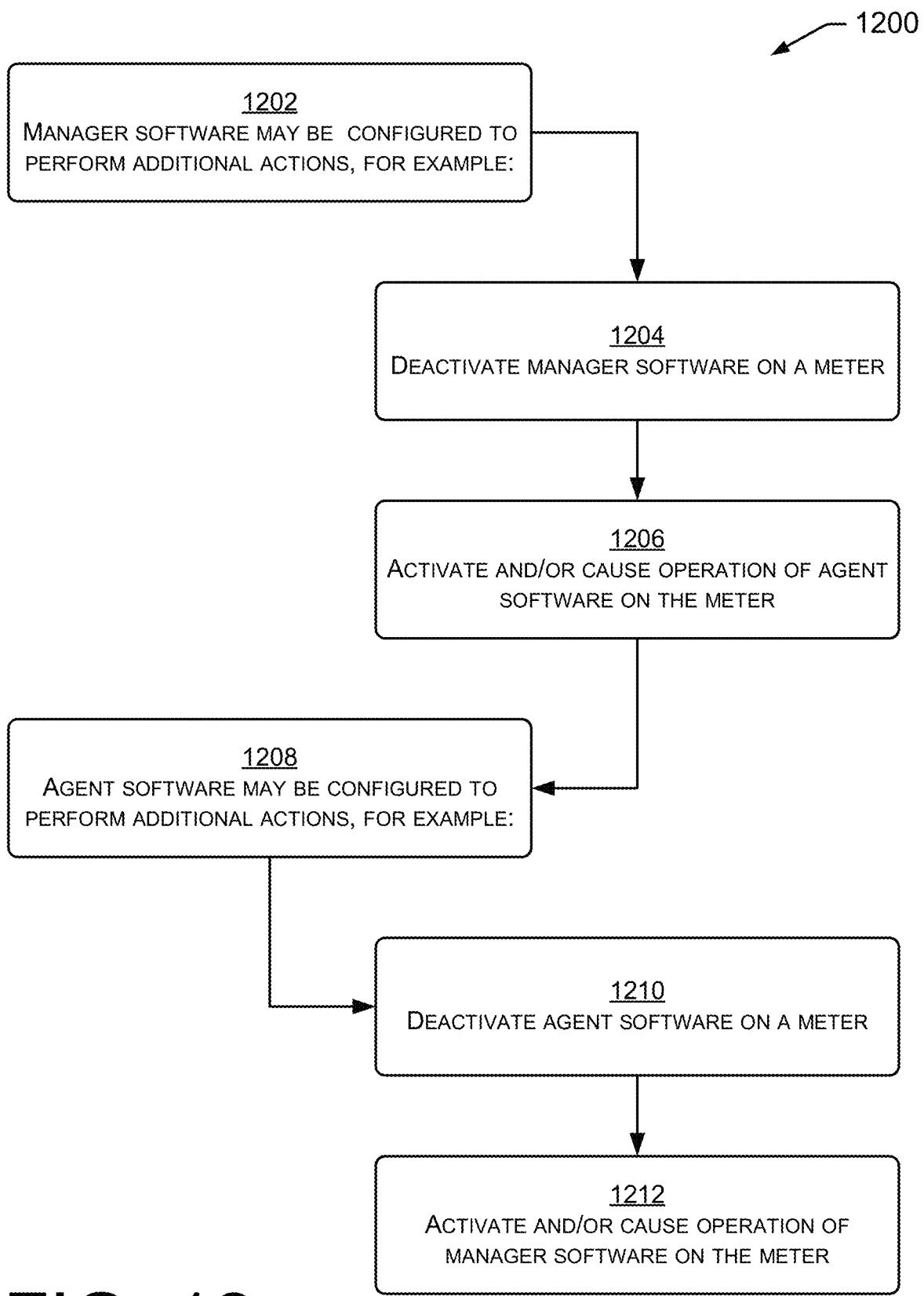
FIG. 12 is a flow diagram showing a further example wherein two meters will exchange their roles as manager and agent.

FIG. 12 shows an example method 1200 by which two meters exchange their roles as manager and agent.

At block 1202, an example is described wherein manager software is configured to perform additional actions. At block 1204, the manager software is configured to deactivate its own operation on a meter and to perform an orderly shutdown. In the example of block 1206, the orderly shutdown may include activation (or transmission of a message to signal the activation) of agent software on the electricity meter shutting down operation of its manager software.

At block 1208, an example is described wherein agent software may be configured to perform additional actions. At block 1210, the agent software is configured to deactivate its own operation on a meter and to perform an orderly shutdown. In the example of block 1212, the orderly shutdown may include activation (or transmission of a message to signal the activation) of manager software on the electricity meter shutting down operation of its agent software.

Example Systems, Methods and Devices

The following examples of efficient collaboration between meters under the same transformer are expressed as number clauses. While the examples illustrate a number of possible configurations and techniques, they are not meant to be an exhaustive listing of the systems, methods, and/or techniques described herein.

1. An electricity distribution system, comprising: a first meter connected to a first transformer, wherein the first meter comprises: a first processor; a first memory device; and first agent software defined on the first memory device and executed by the first processor, wherein execution of the first agent software is configured to perform actions comprising: relaying a first message from a first application of a first type of application operating on the first meter; and a second meter connected to the first transformer, wherein the second meter comprises: a second processor; a second memory device; and second agent software defined on the second memory device and executed by the second processor, wherein execution of the second agent software is configured to perform actions comprising: receiving the first message; and relaying the first message to a second application of the first type of application operating on the second meter.

2. The electricity distribution system of clause 1, wherein execution of the second agent software is configured to perform actions comprising: relaying a second message, comprising a response to the first message, from the second application to the first agent software of the first meter.

3. The electricity distribution system of clause 2, additionally comprising: a third meter connected to the first transformer, wherein the third meter comprises: a third processor; a third memory device; and first manager software, defined on the third memory device and executed by the third processor, wherein execution of the first manager software is configured to perform actions comprising: receiving a third message from the first application of the first type of application operating on the first meter, wherein the third message was relayed by the first agent software of the first meter and the second agent software of the second meter; and receiving a fourth message from a first application of a second type of application operating on the first meter, wherein the fourth message was relayed by the first agent software of the first meter and the second agent software of the second meter.

4. The electricity distribution system of clause 3, additionally comprising: a fourth meter connected to a second transformer, wherein the fourth meter comprises: a fourth processor; a fourth memory device; and third agent software, defined on the fourth memory device and executed by the fourth processor; wherein execution of the third agent software relays the third message and the fourth message.

5. The electricity distribution system of clause 3, wherein execution of the first manager software is configured to perform additional actions comprising: sending a fifth message, comprising data obtained from the third message and the fourth message, to a server.

6. The electricity distribution system of clause 5, wherein: the first message relayed by the first meter comprises a first networking score; the second message relayed by the second meter comprises a second networking score; the fifth message sent by the third meter comprises a third networking score; and execution of software within the electricity distribution system performs actions comprising: determining at least one of (a) whether operation of the first manager software should be discontinued, or (b) a meter on which to operate second manager software, based at least in part on: the first networking score; the second networking score; and the third networking score.

7. The electricity distribution system of clause 3, wherein execution of the first manager software is configured to perform additional actions comprising: comparing networking scores of meters connected to the first transformer to determine a best score from among scores of the meters connected to the first transformer; selecting a meter to instruct to execute manager software based on the best score; and ceasing to execute the first manager software on the third meter based on the third meter not being selected.

8. The electricity distribution system of clause 3, wherein: execution of the first manager software is configured to perform additional actions comprising: deactivating the first manager software on the third meter; and operating a third agent software on the third meter; and execution of the first agent software is configured to perform actions comprising: deactivating the first agent software on the first meter; and operating second manager software on the first meter.

9. A metering device, comprising: a processor; a memory device; agent software defined on the memory device and executed by the processor, wherein execution of the agent software performs actions comprising: relaying a first message from a first application of a first type of application operating on the metering device; and relaying a second message from a second application of a second type of application operating on the metering device; and manager software, defined on the memory device and executed by the processor, wherein the manager software is executed when the agent software is not being executed, and wherein execution of the manager software is configured to perform actions comprising: receiving a third message from a third application of the first type of application operating on a second meter; and receiving a fourth message from a fourth application of the second type of application operating on the second meter.

10. The metering device as recited in clause 9, wherein execution of the agent software performs additional actions comprising: relaying a fifth message from a fifth application of the first type of application operating on a remote metering device; and relaying a sixth message from a sixth application of the second type of application operating on the remote metering device.

11. The metering device as recited in clause 9, wherein execution of the agent software performs additional actions comprising: adding a networking score of the metering device to the first message.

12. The metering device as recited in clause 9, wherein execution of the agent software performs additional actions comprising: calculating a networking score based at least in part on a likelihood of a packet sent by the agent software to arrive at an indicated destination.

13. The metering device as recited in clause 9, wherein execution of the agent software performs additional actions comprising: calculating a networking score based at least in part on power or energy used to send or receive a message. The networking score may also be based at least in part on signal strength and/or the signal to noise ratio of a transmitted or received signal. The networking score may also be based at least in part on the number of one-hop neighbors and/or hop-count of a network device from root node of the network, with a higher networking score given to network devices with more one-hop neighbors and/or with a lower hop-count to the root device.

14. The metering device as recited in clause 9, wherein execution of the agent software performs additional actions comprising: receiving signal strength information calculated by a remote meter; and calculating a networking score based at least in part on the signal strength information.

15. The metering device as recited in clause 9, wherein execution of the manager software performs additional actions comprising executing the manager software when: a networking score of the metering device exceeds networking scores of all other metering devices connected to a common transformer; and the networking score of the metering device is greater than a threshold value more than a networking score of a current manager metering device connected to the common transformer.

16. A method, comprising: relaying, by operation of a first agent software operating on a first network device, a first message generated by a first application of a first type of application to second agent software operating on a second network device; and relaying, by operation of the second agent software operating on the second network device, the first message to a second application of the first type of application.

17. The method of clause 16, wherein: the first network device and the second network device are a first electricity meter and a second electricity meter, respectively; and the first agent software relays the first message to instances of agent software operating on each of a plurality of electricity meters connected to a same transformer, wherein the first message comprises instructions to relay the first message to applications of the first type of application respectively located on utility meters connected to the same transformer; and the first agent software relays a second message of a second type of application to each of the plurality of electricity meters connected to the same transformer with instructions to relay the second message to applications of the second type of application respectively located on utility meters connected to the same transformer.

18. The method of clause 17, additionally comprising: relaying, by operation of the first agent software operating on the first electricity meter, the first message to manager software operating on a third electricity meter with instructions to relay the first message to a third application of the first type of application operating on the third electricity meter.

19. The method of clause 17, wherein: the instances of agent software operating on each of the plurality of electricity meters connected to the same transformer relay a response to the first message, from a respective application of the first type of application.

20. The method of clause 17, additionally comprising: calculating a networking score; and including the networking score with the first message. In an example, each device calculates its own networking score, which is used to determine which device will run the manager software. In examples, the networking score can be calculated based on factors comprising: (1) a percentage of missed packets by the device; (2) a percentage of devices attached to the same transformer with which the device has one-hop communication; and/or (3) a required signal strength to reach each of the other devices.

CONCLUSION

Although the subject matter has been described in language specific to structural features and/or methodological acts, it is to be understood that the subject matter defined in the appended claims is not necessarily limited to the specific features or acts described. Rather, the specific features and acts are disclosed as exemplary forms of implementing the claims.

The invention claimed is:

1. An electricity distribution system, comprising:
a first meter connected to a first transformer, wherein the first meter comprises:
a first processor;
a first memory device; and
agent software defined on the first memory device and executed by the first processor, wherein execution of the agent software is configured to perform actions comprising:
relaying a first message from a first application of a first type of application operating on the first meter; and
a second meter connected to the first transformer, wherein the second meter comprises:
a second processor;
a second memory device; and
manager software defined on the second memory device and executed by the second processor, wherein execution of the manager software is configured to perform actions comprising:
relaying the first message from the first application of the first type of application operating on the first meter;
selecting the first meter to execute manager software;
ceasing to execute the manager software on the second meter; and
executing agent software on the second meter.

2. The electricity distribution system of claim 1, wherein execution of the agent software on the second meter is configured to perform actions comprising:
relaying a second message, comprising a response to the first message.

3. The electricity distribution system of claim 2, additionally comprising:
a third meter connected to the first transformer, wherein the third meter comprises:
a third processor;
a third memory device; and
agent software, defined on the third memory device and executed by the third processor, wherein execution of the agent software is configured to perform actions comprising:
receiving a third message from the first application of the first type of application operating on the first meter, wherein the third message was relayed by the agent software of the first meter and the second agent software of the second meter; and
receiving a fourth message from a first application of a second type of application operating on the first meter, wherein the fourth message was relayed by the agent software of the first meter and the agent software of the second meter.

4. The electricity distribution system of claim 3, additionally comprising:
a fourth meter connected to a second transformer, wherein the fourth meter comprises:
a fourth processor;
a fourth memory device; and
agent software, defined on the fourth memory device and executed by the fourth processor;
wherein execution of the agent software relays the third message and the fourth message.

5. The electricity distribution system of claim 3, wherein execution of the first manager software of the first meter is configured to perform additional actions comprising:
sending a fifth message, comprising data obtained from the third message and the fourth message, to a server.

6. The electricity distribution system of claim 5, wherein:
the first message relayed by the first meter comprises a first networking score;
the second message relayed by the second meter comprises a second networking score;
the fifth message sent by the manager software of the first meter comprises a third networking score; and
execution of software within the electricity distribution system performs actions comprising:
assigning a meter to run manager software based at least in part on:
the first networking score;
the second networking score; and
the third networking score.

7. The electricity distribution system of claim 3, wherein execution of the manager software is configured to perform additional actions comprising:
comparing networking scores of meters connected to the first transformer to determine a best score from among scores of meters connected to the first transformer;
wherein networking scores of meters are used to select a meter to be instructed to execute manager software.

8. The electricity distribution system of claim 3, wherein:
execution of the manager software is configured to perform additional actions comprising:
deactivating the manager software on the first meter; and
operating agent software on the first meter.

9. A metering device, comprising:
a processor;
a memory device;
agent software defined on the memory device and executed by the processor, wherein execution of the agent software performs actions comprising:
relaying a first message from a first application of a first type of application operating on the metering device; and
relaying a second message from a second application of a second type of application operating on the metering device; and
manager software, defined on the memory device and executed by the processor, wherein the manager software is executed when the agent software is not being executed, and wherein execution of the manager software is configured to perform actions comprising:
receiving a third message from a third application of the first type of application operating on a second meter; and
receiving a fourth message from a fourth application of the second type of application operating on the second meter.

10. The metering device as recited in claim 9, wherein execution of the agent software performs additional actions comprising:
relaying a fifth message from a fifth application of the first type of application operating on a remote metering device; and
relaying a sixth message from a sixth application of the second type of application operating on the remote metering device.

11. The metering device as recited in claim 9, wherein execution of the agent software performs additional actions comprising:
adding a networking score of the metering device to the first message.

12. The metering device as recited in claim 9, wherein execution of the agent software performs additional actions comprising:
calculating a networking score based at least in part on a likelihood of a packet sent by the agent software to arrive at an indicated destination.

13. The metering device as recited in claim 9, wherein execution of the agent software performs additional actions comprising:
calculating a networking score based at least in part on power or energy used to send or receive a message.

14. The metering device as recited in claim 9, wherein execution of the agent software performs additional actions comprising:
receiving signal strength information calculated by a remote meter; and
calculating a networking score based at least in part on the signal strength information.

15. The metering device as recited in claim 9, wherein execution of the manager software performs additional actions comprising executing the manager software when:
a networking score of the metering device exceeds networking scores of all other metering devices connected to a common transformer; and
the networking score of the metering device is greater than a threshold value more than a networking score of a current manager metering device connected to the common transformer.

16. A method, comprising:
calculating a networking score for each of a first network device and a second network device, wherein the first network device and the second network device are connected to a common transformer;
selecting the first network device to execute manager software, wherein the first network device is selected based on the networking score of the first network device being higher than the networking score of the second network device;
selecting the second network device to execute agent software;
relaying, by operation of the agent software operating on the second network device, a first message generated by a first application of a first type of application to the manager software operating on the first network device; and
relaying, by operation of the manager software operating on the first network device, the first message to a data collector.

17. The method of claim 16, wherein:
the first network device and the second network device are a first electricity meter and a second electricity meter, respectively; and
the agent software relays a second message of a second type of application to one or more of a plurality of electricity meters connected to the common transformer with instructions to relay the second message to applications of the second type of application respectively located on utility meters connected to the common transformer.

18. The method of claim 17, additionally comprising:
relaying, by operation of agent software operating on a third electricity meter, a third message to the agent software operating on the second electricity meter.

19. The method of claim 17, wherein:
instances of agent software operating on one or more of the plurality of electricity meters connected to the common transformer relay a response to the first message, from a respective application of the first type of application.

20. The method of claim 17, additionally comprising:
including the networking score of each electricity meter in messages sent by that electricity meter.

21. An electricity distribution system, comprising:
a first meter connected to a first transformer, wherein the first meter comprises:
a first processor;
a first memory device; and
agent software defined on the first memory device and executed by the first processor, wherein execution of the agent software is configured to perform actions comprising:
relaying a first message from a first application of a first type of application operating on the first meter; and
a second meter connected to the first transformer, wherein the second meter comprises:
a second processor;
a second memory device; and
second agent software defined on the second memory device and executed by the second processor, wherein execution of the second agent software is configured to perform actions comprising:
　　receiving the first message; and
　　relaying the first message to a second application of the first type of application operating on the second meter;
wherein execution of the agent software on the second meter is configured to perform actions comprising:
　　relaying a second message, comprising a response to the first message, from the second application to the agent software of the first meter;
a third meter connected to the first transformer, wherein the third meter comprises:
　　a third processor;
　　a third memory device; and
　　manager software, defined on the third memory device and executed by the third processor, wherein execution of the manager software is configured to perform actions comprising:
　　　　receiving a third message from the first application of the first type of application operating on the first meter, wherein the third message was relayed by the agent software of the first meter and the agent software of the second meter; and
　　　　receiving a fourth message from a first application of a second type of application operating on the first meter, wherein the fourth message was relayed by the agent software of the first meter and the agent software of the second meter.

22. A method, comprising:
relaying, by operation of a first agent software operating on a first network device, a first message generated by a first application of a first type of application to second agent software operating on a second network device, wherein generating the first message comprises:
　　calculating a networking score; and
　　including the networking score with the first message;
relaying, by operation of the second agent software operating on the second network device, the first message to a second application of the first type of application,
wherein:
　　the first network device and the second network device are a first electricity meter and a second electricity meter, respectively;
　　the first agent software relays the first message to instances of agent software operating on each of a plurality of electricity meters connected to a common transformer, wherein the first message comprises instructions to relay the first message to applications of the first type of application respectively located on utility meters connected to the common transformer; and
　　the first agent software relays a second message of a second type of application to one or more of the plurality of electricity meters connected to the common transformer with instructions to relay the second message to applications of the second type of application respectively located on utility meters connected to the common transformer.

* * * * *